United States Patent [19]

Chang

[11] Patent Number: 4,963,771

[45] Date of Patent: Oct. 16, 1990

[54] TTL/CMOS LEVEL TRANSLATOR

[75] Inventor: Shuen-Chin Chang, San Jose, Calif.

[73] Assignee: Samsung Semiconductor, San Jose, Calif.

[21] Appl. No.: 406,721

[22] Filed: Sep. 12, 1989

[51] Int. Cl.$^5$ .................. H03K 17/16; H03K 19/0175
[52] U.S. Cl. .................................... 307/475; 307/451; 307/542; 307/572
[58] Field of Search ............... 307/443, 448, 451, 475, 307/542, 572

[56] References Cited

U.S. PATENT DOCUMENTS 4,209,713 6/1980 Satou et al. ........................ 307/443
4,806,801 2/1989 Argade et al. ..................... 307/475

Primary Examiner—Stanley D. Miller
Assistant Examiner—Margaret Rose Wambach
Attorney, Agent, or Firm—Hecker & Harriman

[57] ABSTRACT

The present invention implements a static inverter-type TTL/CMOS level translator. The present invention utilizes a pair of transistors to suppress hot electron effects. The transistor pair limits maximum VDS to VCC-VTN at the first and second gain stages. A pair of resistors serve as a virtual VCC modulator to minimize voltage variations, stabilizing the VIL/VIH trip point. The resistors also minimize standby current so that the translator of the present invention can be used in a low standby current environment. The translator of the present invention provides faster speed, wider process margins, better reliability and lower standby current than prior art translators.

11 Claims, 2 Drawing Sheets

TTL/CMOS LEVEL TRANSLATOR

BACKGROUND OF THE PRESENT INVENTION

1. Field of the Invention

This invention relates to the field of voltage level translation circuits, and in particular, to the translation of Transistor-Transistor Logic (TTL) signals to Complementary Metal Oxide Silicon (CMOS) voltage levels.

2. Background Art

It is often desired to provide an interface between CMOS (integrated circuit) devices and TTL circuitry. In providing such an interface, it is necessary to convert the voltage levels of the TTL circuitry to levels which may be utilized in the CMOS circuitry.

Previous technology for the interface circuits involve comparator circuits with a reference voltage set for the mid-point of the TTL specification (e.g., 1.4–1.6 volts). Other prior art circuitry involved a CMOS inverter stage with transistor sizes selected to optimize the switching threshold near the TTL specification point. However, comparator circuits suffer from poor accuracy and are not suited for high-speed operation.

The CMOS inverter circuit is sensitive to process variations as it depends upon the relationship of transistor characteristics between P-channel and N-channel transistors. The two different devices (P-channel and N-channel) do not "track" or self-compensate in typical wafer fabrication processes. As a result, the switching threshold varies too much to ensure proper operation in the typical range of process variations and operating environments.

Another prior art TTL/CMOS translator is the static inverter type of translator. A static inverter-type of translator consists of 2 inverter stages of complementary transistors. The input TTL signal provides the gate voltage of the first drain coupled transistor pair. The first pair acts as a voltage divider and the output of this first pair is coupled to the gates of the second complementary pair. The output of the second stage is taken from the drain of the P-type transistor. Static inverter types of translators are not suitable for low standby current applications. These translators also suffer from VTN degradation induced by hot electron effects. In addition, such translators require very tight process control to achieve a stable VIL/VIH trip point.

One method of improving low standby current performance for prior art static inverter translators is to use longer channels and weaker transistors to reduce standby current and reduce hot electron effects on VTN degradation. However, this improves standby current and the process windows at the expense of speed.

Therefore, it is an object of the present invention to minimize the standby current and maintain the high-speed operation of a static inverter-type TTL/CMOS level translator.

It is another object of the present invention to suppress hot electron-induced VTN degradation in a TTL/CMOS translator.

It is yet another object of the present invention to provide a TTL/CMOS level translator with wide process window margins.

SUMMARY OF THE PRESENT INVENTION

The present invention implements a static inverter-type TTL/CMOS level translator. The present invention utilizes a pair of transistors to suppress hot electron effects. The transistor pair limits maximum VDS of N-channel transistors to VCC minus VTN at the first and second gain stages.

A pair of resistors serve as a virtual VCC modulator to minimize voltage variations, stabilizing the VIL/VIH trip point. The resistors also minimize standby current so that the translator of the present invention can be used in a low standby current environment. The translator of the present invention provides faster speed, wider process margins, better reliability and lower standby current than prior art translators.

The present invention provides an electrical circuit for translating TTL input levels to CMOS output levels. The input stage of the present invention includes a complementary pair of transistors, gate coupled to a TTL input. A third transistor is coupled between the complementary pair of transistors and is gate coupled to a first supply voltage. This additional transistor clamps the voltage at its source to a maximum level to minimize hot electron effects.

The output of the first stage is coupled to a second inverter stage, again comprising a pair of complementary transistors. A third transistor is coupled between the complementary pair to suppress hot electron effects. The additional transistor of the second stage is coupled to a second supply voltage. The first and second supply voltages may be identical in the present invention.

Resistors are inserted between the supply voltage and the source of the P channel transistors of the first and second stages so as to supply a virtual supply voltage at the source of the P transistors. This stabilizes the VIL/VIH trip point by minimizing the effect of supply voltage swings on the virtual VCC.

DETAILED DESCRIPTION OF THE PRESENT INVENTION

A TTL/CMOS level translator is described. In the following description, numerous specific details, such as number of transistors, voltage levels, etc., are described in order to provide a more thorough description of the present invention. It will be apparent, however, to one skilled in the art, that the present invention may be practiced without these specific details. In other instances, well known features have not been described in detail so as not to obscure the present invention.

Figure 1:
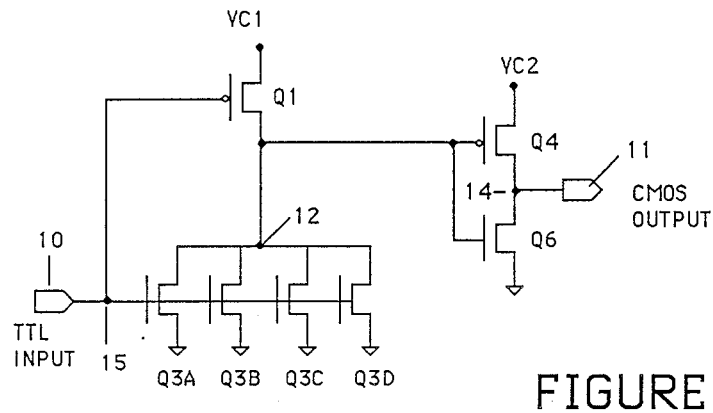
FIG. 1 is a circuit diagram of a prior art static inverter TTL/CMOS level translator.

An example of a prior art static inverter type of TTL/CMOS level translator is illustrated in FIG. 1. The TTL input 10 is coupled at node 15 to the gates of transistor Q1 and transistor string Q3A–Q3D. Transistor Q1 is a P-type transistor whose source is coupled to voltage VC1. The drain of transistor Q1 is coupled to the drains of transistors Q3A–Q3D at node 12 and to the gates of transistors Q4 and Q6. The sources of transistors of Q3A–Q3D are coupled to ground. Transistors Q3A–A3D are N-type transistors. The source of P-type transistor Q4 is coupled to voltage VC2. The drain of transisitor Q4 is coupled to the drain of N-type transistor Q6 at node 14. The source of transistor Q6 is coupled to ground. The CMOS output 11 is taken from node 14.

The static inverter translator of FIG. 1 consists of two inverter stages. The first inverter stage is comprised of P channel Transistor Q1 and N channel transistors Q3A-Q3D. The output of this first stage at node 12 is coupled to the second inverter stage. The second inverter stage is comprised of P type transistor Q4 and N type transistor Q6.

For a particular input voltage VIL from the TTL circuit, the translator should output a logical "0". For an input VIH voltage from the TTL circuit, the translator circuit should be a logical "1". However, the TTL input conditions are not always stable. In addition, hot electron effects can degrade VTN. Therefore, the VIL/VIH trip point may vary.

When the input 10 is low, (e.g., less than 0.8 volt) transistor Q1 is turned on and transistors Q3A-Q3D are off. The output of the first inverter stage at Node 12 is VC1. This voltage turns transistor Q4 off and turns transistor Q6 on. This drops the signal at the output of the second inverter stage at Node 14 low, providing a logical "0" output. When the input 10 is high, transistors Q3A-Q3D are turned on. Thus, the output at Node 12 is low (e.g., 0.8 volt). This turns on transistor Q4 and turns transistor Q6 off, so that the output at Node 14 of the second inverter stage is high approaching VC2, providing a logical "1" output 11.

Due to hot electron effects, the voltage VTN can suffer from degradation at transistors Q3A-Q3D. This can lead to incorrect output from the TTL/CMOS level translator.

The hot electron effect degrades VT for transistors Q3A-Q3D. The voltage at node 12 is made unstable by this effect. When the input 10 switches from VIL to VIH, the node 12 is to be discharged through transistors Q3A-Q3D. However, hot electron effects can shift VT higher for transistors Q3A-Q3D. If VT is shifted higher than designed specifications, node 12 may not discharge at the predicted VIL/VIH trip point. This can lead to a false low reading at the output of the translator.

The prior art translator of FIG. 1 also suffers in low standby current conditions. Because, for example, when input 10 is at VIH (e.g., 2.4 volts), both Q1 and Q3A-Q3D are turned on at the same time. The standby current of the first inverter stage is mainly determined by the turn-on resistances of Q1 and Q3A-Q3D, and not current-limited for the low standby current applications. Also, because the P-channel transistor Q1 and N-channel transistor Q3A-Q3D are ratioed, a stable trip point depends on a stable power supply VCC. If the power supply varies from 4.5 to 5.5 volts, for example, a full 1 volt variation is seen by transistor Q1. Consequently the VIL/VIH trip point varies. The present invention provides a virtual VCC which is less sensitive to power supply fluctuations.

The present invention also utilizes two inverter stages to accomplish TTL/CMOS level translation. The first stage (input stage) is comprised of a complementary pair of transisitors, one P type and one N type. The transistor pair is gate coupled to the TTL input voltage. A third transistor is coupled between the drains of the complementary pair and gate coupled to a supply voltage. This extra transistor clamps the voltage at the drain of the N-channel transistors to a fixed maximum level so as to suppress hot electron effects.

The output of the first inverter stage is coupled to the gates of a second complementary pair of transistors. As in the first stage, an additional transistor is coupled between the drains of the complementary pair to suppress hot electron effects. This additional transistor is gate coupled to a second supply voltage which may be identical to the first supply voltage.

Resistors are used between the sources of the P channel transistors and the supply voltages to provide a virtual VCC at the source of the P channel transistors. The resistors reduced the effects of voltage swings in the supply voltages VC1 and VC2, so that the net effect on the virtual supply voltage is minimized. This stabilizes the VIL-VIH trip point.

Figure 2:
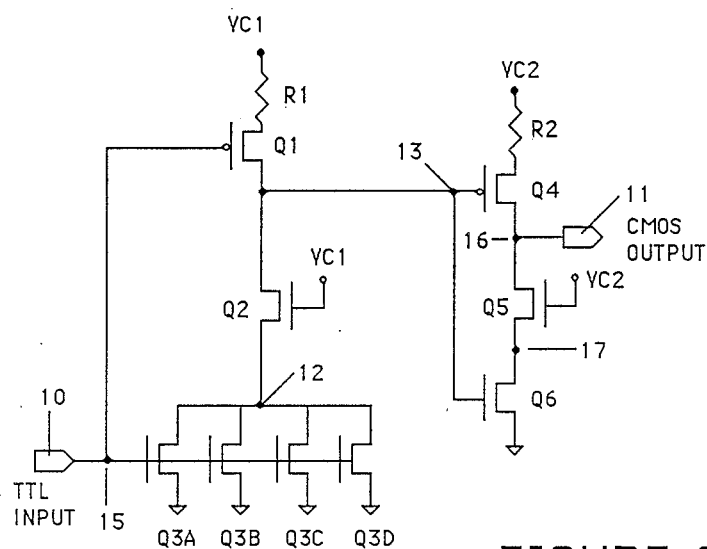
FIG. 2 is a circuit diagram of the level translator of the preferred embodiment of the present invention.

The preferred embodiment of the present invention is illustrated in FIG. 2. The present invention also comprises a static inverter type of TTL/CMOS translator. The present invention provides resistors R1 and R2 to minimize the standby current of a prior art-type of level translator. Resistor R1 is coupled between voltage VC1 and the source of transistor Q1. Resistor R2 is coupled between VC2 and the source of transistor Q4.

The present invention also provides two hot electron suppression transistors (Q2 and Q5) to suppress the hot electron-induced VTN degradation on transistors Q3A-Q3D and transistor Q6. The drain of transistor Q2 is coupled to the drain of transistor Q1 at node 13. The source of transistor Q2 is coupled to the drain of transistors Q3A-Q3D at node 12. The gate of transistor Q2 is coupled to VC1.

The drain of transistor Q5 is coupled to the drain of transistor Q4 at node 16. The source of transistor Q5 is coupled to the drain of transistor Q6 at node 17. The gate of transistor Q5 is coupled to VC2. The CMOS output 11 is taken from node 16.

The present invention reduces the effect of VT degradation due to hot electron phenomena by stabilizing the voltage at nodes 12 and 17. The present invention provides N-channel transistors Q2 and Q5 to clamp the voltage at nodes 12 and 17. The highest voltage possible at node 12, for example, is VC1-VT(Q2). As a result, the response of the stages of the inverter are predicable and hot electron effects are minimized.

The resistors R1 and R2 are utilized to provide a virtual supply voltage at the source of transistors Q1 and Q4, respectively, which is more stable than in the prior art translator. As noted above, a 1 volt swing in the supply voltage VC1 results in a full 1 volt swing in cross transistors Q1 and Q4 in the prior art. The resistors act as a feedback control for the virtual supply voltage of the first stage. For example, for a 5.5 volts VC1, the voltage drop across R1 may be approximately 0.5 volts. Therefore, the virtual supply voltage at the source of transistor Q1 is 5 volts. If the supply voltage VC1 drops to 4.5 volts, the voltage drop across R1 may be 0.1 volt, for example, because the current is lower. Therefore, the voltage at the source of transistor Q1 is 4.4 volts. For a 1 volt voltage swing of VC1, only a 0.6 volt swing (5 volts-4.4 volts) is seen at the virtual supply voltage at the source of transistor Q1. The use of resistors stabilizes the supply voltage swings.

In the preferred embodiment of the present invention, the values of resistors R1 and R2 depend on performance requirements. For a high speed translator, the R1 and R2 values are set low, such as for example, 1 Kohm. For lower speed, but better VIH performance, higher values of R1 and R2 may be utilized, such as in the range of 4 Kohm.

In the preferred embodiment of the present invention, nominal values for VT for transistors Q3A-Q3D are approximately 0.8 volts. VT for transistor Q1 is approximately −1 volt.

Transistors Q2 and Q5 limit the maximum drain source voltage VDS to VCC-VTN at nodes 12 and 17.

Figure 3:
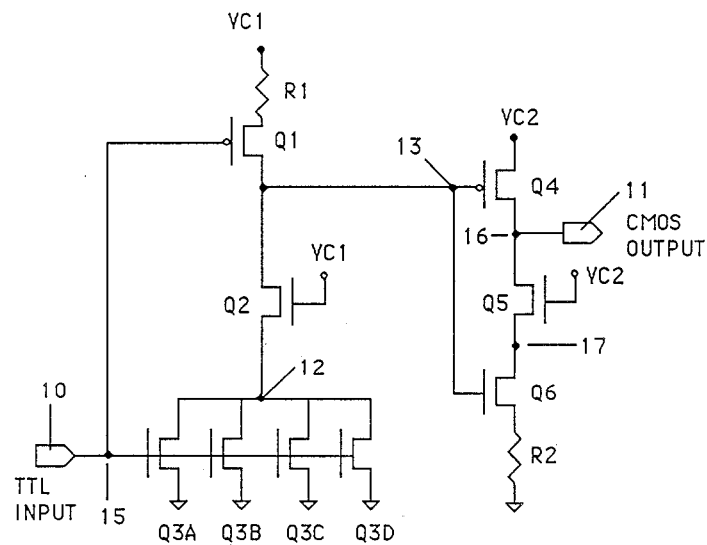
FIG. 3 is a circuit diagram of an alternate embodiment of the present invention.

In the preferred embodiment of the present invention, VC1 and VC2 are equal to approximately 5 volts. In an alternate embodiment, resistor R2 is placed between the source of transistor Q6 and ground, as shown in FIG. 3.

Thus, an improved TTL/CMOS level translator has been described.

I claim:

1. An electrical circuit for translating transistor-transistor logic (TTL) input voltage levels to complementary metal oxide semiconductor (CMOS) voltage levels comprising:
    an input stage comprising a first complementary pair of drain coupled first and second transistors of first and second conductivity type, respectively, said first transistor source coupled to a first supply voltage, said second transistor gate coupled to said first supply voltage;
    a third transistor of said second conductivity type, said third transistor gate coupled to said TTL input, source coupled to ground and drain coupled to the source of said second transistor;
    said TTL input coupled to the gate of said first transistor;
    an output stage comprising a second complementary pair of drain coupled fourth and fifth transistors of said first and second conductivity type, respectively, said fourth transistor source coupled to a second supply voltage, said fifth transistor gate coupled to said second supply voltage;
    a sixth transistor of said second conductivity type, said sixth transistor gate coupled to said drain of said first transistor, source coupled to ground, and drain coupled to the source of said fifth transistor; and
    said CMOS voltage provided at the drain of said fifth transistor.

2. The circuit of claim 1 further including a first resistor coupled between said first supply voltage and the source of said first transistor and a second resistor coupled between said second supply voltage and the source of said fourth transistor.

3. The circuit of claim 1 wherein said first conductivity type comprises P-type conductivity.

4. An electrical circuit for translating transistor-transistor logic (TTL) input voltage levels to complementary metal oxide semiconductor (CMOS) voltage levels comprising:
    an input stage comprising a first complementary pair of drain coupled first and second transistors of first and second conductivity type, respectively, said first transistor source coupled to a first supply voltage, said second transistor gate coupled to said first supply voltage;
    a plurality of third transistors of said second conductivity type, said third transistors gate coupled to said TTL input, source coupled to ground and drain coupled to the source of said second transistor;
    said TTL input coupled to the gate of said first transistor;
    an output stage comprising a second complementary pair of drain coupled fourth and fifth transistors of said first and second conductivity type, respectively, said fourth transistor source coupled to a second supply voltage, said fifth transistor gate coupled to said second supply voltage;
    a sixth transistor of said second conductivity type, said sixth transistor gate coupled to said drain of said first transistor, source coupled to ground, and drain coupled to the source of said fifth transistor; and
    said CMOS voltage provided at the drain of said fifth transistor.

5. The circuit of claim 4 further including a first resistor coupled between said first supply voltage and the source of said first transistor and a second resistor coupled between said second supply voltage and the source of said fourth transistor.

6. The circuit of claim 4 wherein said first conductivity type comprises P-type conductivity.

7. An electrical circuit for translating transistor-transistor logic (TTL) input voltage levels to complementary metal oxide semiconductor (CMOS) voltage levels comprising:
    an input stage comprising a first complementary pair of drain coupled first and second transistors of first and second conductivity type, repectively, said first transistor source coupled through a first resistor to a first supply voltage, said second transistor gate coupled to said first supply voltage;
    a third transistor of said second conductivity type, said third transistor gate coupled to said TTL input, source coupled to ground and drain coupled to the source of said second transistor;
    said TTL input coupled to the gate of said first transistor;
    an output stage comprising a second complementary pair of drain coupled fourth and fifth transistors of said first and second conductivity type, respectively, said fourth transistor source coupled through a second resistor to a second supply voltage, said fifth transistor gate coupled to said second supply voltage;
    a sixth transistor of said second conductivity type, said sixth transistor gate coupled to said drain of said first transistor, source coupled to ground, and drain coupled to the source of said fifth transistor; and
    said CMOS voltage provided at the drain of said fifth transistor.

8. The circuit of claim 7 wherein said first conductivity type comprises P-type conductivity.

9. An electrical circuit for translating transistor-transistor logic (TTL) input voltage levels to complementary metal oxide semiconductor (CMOS) voltage levels comprising:
    an input stage comprising a first complementary pair of drain coupled first and second transistors of first and second conductivity type, repectively, said first transistor source coupled through a first resistor to a first supply voltage, said second transistor gate coupled to said first supply voltage;
    a plurality of third transistors of said second conductivity type, said third transistors gate coupled to said TTL input, source coupled to ground and drain coupled to the source of said second transistor;
    said TTL input coupled to the gate of said first transistor;
    an output stage comprising a second complementary pair of drain coupled fourth and fifth transistors of said first and second conductivity type, respectively, said fourth transistor source coupled through a second resistor to a second supply voltage, said fifth transistor gate coupled to said second supply voltage;

a sixth transistor of said second conductivity type, said sixth transistor gate coupled to said drain of said first transistor, source coupled to ground, and drain coupled to the source of said fifth transistor; and said CMOS voltage provided at the drain of said fifth transistor.

10. The circuit of claim 9 wherein said first conductivity type comprises P-type conductivity.

11. An electrical circuit for translating transistor-transistor logic (TTL) input voltage levels to complementary metal oxide semiconductor (CMOS) voltage levels comprising:

an input stage comprising a first complementary pair of drain coupled first and second transistors of first and second conductivity type, repectively, said first transistor source coupled through a first resistor to a first supply voltage, said second transistor gate coupled to said first supply voltage;

a plurality of third transistors of said second conductivity type, said third transistors gate coupled to said TTL input, source coupled to ground and drain coupled to the source of said second transistor;

said TTL input coupled to the gate of said first transistor;

an output stage comprising a second complementary pair of drain coupled fourth and fifth transistors of said first and second conductivity type, respectively, said fourth transistor source coupled to a second supply voltage, said fifth transistor gate coupled to said second supply voltage;

a sixth transistor of said second conductivity type, said sixth transistor gate coupled to said drain of said first transistor, source coupled through a second resistor to ground, and drain coupled to the source of said fifth transistor; and said CMOS voltage provided at the drain of said fifth transistor.

* * * * *